(12) United States Patent
Jang et al.

(10) Patent No.: US 9,412,631 B2
(45) Date of Patent: Aug. 9, 2016

(54) CEILING STORAGE DEVICE CAPABLE OF WAFER PURGING

(71) Applicant: Daifuku Co., Ltd., Osaka-shi (KR)

(72) Inventors: Jae Won Jang, Asan-si (KR); Ho Geun Lee, Cheonan-si (KR); Jun Pil Yun, Cheonan-si (KR); Jung Young Lee, Asan-si (KR); Sung Goo Choi, Asan-si (KR)

(73) Assignee: DAIFUKU CO., LTD., Osaka-shi (JP)

( * ) Notice: Subject to any disclaimer, the term of this patent is extended or adjusted under 35 U.S.C. 154(b) by 0 days.

(21) Appl. No.: 14/395,878

(22) PCT Filed: Oct. 7, 2013

(86) PCT No.: PCT/KR2013/008923
§ 371 (c)(1),
(2) Date: Oct. 21, 2014

(87) PCT Pub. No.: WO2014/069804
PCT Pub. Date: May 8, 2014

(65) Prior Publication Data
US 2015/0235884 A1    Aug. 20, 2015

(30) Foreign Application Priority Data

Oct. 31, 2012  (KR) .................. 10-2012-0122129

(51) Int. Cl.
*H01L 21/677*    (2006.01)
*H01L 21/673*    (2006.01)

(52) U.S. Cl.
CPC ........ *H01L 21/67389* (2013.01); *H01L 21/677* (2013.01)

(58) Field of Classification Search
CPC ............ H01L 21/677; H01L 21/67389; H01L 21/67393; H01L 21/67769
See application file for complete search history.

(56) References Cited

U.S. PATENT DOCUMENTS 7,077,173 B2 * 7/2006 Tokunaga ......... H01L 21/67017
141/66
8,231,324 B2 * 7/2012 Yoshida ............... B65G 1/0407
414/280

(Continued)

FOREIGN PATENT DOCUMENTS

| JP | 2008-169005 | 7/2008 |
| KR | 10-2011-0101083 | 9/2011 |
| KR | 10-2012-18062 A | 2/2012 |

OTHER PUBLICATIONS

Int'l. Search Report issued in int'l. App. No. PCT/KR2013/008923, mailed Nov. 19, 2013.
Int'l. Preliminary Report on Patentability issued May 5, 2015.

*Primary Examiner* — Kaitlin Joerger
(74) *Attorney, Agent, or Firm* — Greer Burns & Crain Ltd.

(57) ABSTRACT

The invention provides an apparatus for stocking and purging a wafer at a ceiling. The apparatus includes: a rail that is formed so as to be installed on a ceiling to guide a vehicle; a stock system that is formed so as to be installed on the ceiling and is formed so as to receive a container, which contains wafers, from the vehicle and stock the container; and a purge assembly that is installed so as to communicate with the container through the stock system and is formed so as to purge the wafers, which are contained in the container, with gas.

9 Claims, 3 Drawing Sheets

(56) References Cited

U.S. PATENT DOCUMENTS

| | | | | |
|---|---|---|---|---|
| 8,832,960 B2* | 9/2014 | Kim | ................ | F04F 99/00 118/696 |
| 8,926,251 B2* | 1/2015 | Iizuka | ............... | H01L 21/67389 414/217 |
| 9,064,918 B2* | 6/2015 | Takahara | .......... | H01L 21/67769 |
| 9,199,826 B2* | 12/2015 | Shibata | ............. | H01L 21/67727 |
| 2004/0047714 A1* | 3/2004 | Poli | .................. | H01L 21/67775 414/281 |
| 2004/0237244 A1* | 12/2004 | Suzuki | ............. | H01L 21/67126 15/301 |
| 2011/0056900 A1* | 3/2011 | Inui | .................. | H01L 21/67706 212/98 |
| 2014/0112741 A1* | 4/2014 | Yoshioka | .......... | H01L 21/67359 414/222.01 |
| 2015/0000789 A1* | 1/2015 | Otsuka | .............. | H01L 21/67769 141/369 |
| 2015/0003942 A1* | 1/2015 | Takahara | ............... | A47B 81/00 414/277 |
| 2015/0202664 A1* | 7/2015 | Murata | ............ | H01L 21/67769 134/25.5 |

* cited by examiner

CEILING STORAGE DEVICE CAPABLE OF WAFER PURGING

This is a National Phase Application filed under 35 U.S.C. §371, of International Application No. PCT/KR2013/008923, filed Oct. 7, 2013.

TECHNICAL FIELD

The present invention relates to an apparatus for stocking wafers that are used in a next step in a process for manufacturing a semiconductor.

BACKGROUND ART

Generally, in the process for manufacturing a semiconductor, wafers are produced and the produced wafers are transferred to the next step to manufacture semiconductor packages.

In this case, the produced wafers are not immediately used in the next step and are sequentially sent to the next step when necessary after standing by for a predetermined time. Equipment for stocking the wafers as described above is needed.

Since the equipment for stocking the wafers is installed on the ground in a semiconductor factory, there is a problem in that the equipment for stocking the wafers occupies a large space.

Further, while the wafers are stocked in the equipment, the wafers may also be damaged with time.

DISCLOSURE OF THE INVENTION

Problem that the Invention is to Solve

An object of the invention is to provide an apparatus for stocking and purging a wafer at a ceiling that can improve the availability of a space and increase the time that wafers may be stocked.

Means for Solving the Problem

In order to achieve the object, according to an aspect of the invention, there is provided an apparatus for stocking and purging a wafer at a ceiling. The apparatus may include: a rail that is formed so as to be installed on a ceiling to guide a vehicle; a stock system that is formed so as to be installed on the ceiling and is formed so as to receive a container, which contains wafers, from the vehicle and stock the container; and a purge assembly that is installed so as to communicate with the container through the stock system and is formed so as to purge the wafers, which are contained in the container, with gas.

Here, the stock system may include: a main body; a rack that is installed on the main body and is formed so as to support the container; and fastening units that are installed on the main body and are formed so that the main body is fastened to the ceiling.

Here, the main body may include: a bottom frame on which the rack is installed; and a pair of side wall frames that are joined to both end portions of the bottom frame and includes the fastening units installed at free ends of the side wall frames.

Here, the purge assembly may include: a supply unit that is formed so as to supply the gas into the container; and a discharge unit that is formed so as to discharge the gas, which is supplied into the container, to the outside.

Here, the rack may include a supply nozzle and a discharge nozzle that are formed so as to communicate with the inside of the container, and each of the supply unit and the discharge unit may include a main pipe that is formed so as to extend along the rail and is formed so that the gas flows in the main pipe and a sub-pipe that communicates with the main pipe and is connected to the supply nozzle or the discharge nozzle.

Here, the sub-pipe may include: a first sub-pipe that communicates with the main pipe; and a second sub-pipe that connects the first sub-pipe with the supply nozzle or the discharge nozzle and has a flow cross-sectional area smaller than the flow cross-sectional area of the first sub-pipe.

Here, the supply unit may further include: a supply valve that is installed on the second sub-pipe of the supply unit and is formed so as to open and close the second sub-pipe of the supply unit; and a supply flow meter that is installed on the second sub-pipe of the supply unit so as to be positioned between the supply valve and the supply nozzle and is formed so as to measure a flow rate of the gas flowing in the rack.

Here, the supply unit may further include a gas filter that is installed on the second sub-pipe of the supply unit so as to be positioned between the supply flow meter and the supply nozzle of the rack.

Here, the discharge unit may include: a discharge valve that is installed on the second sub-pipe of the discharge unit and is formed so as to open and close the second sub-pipe of the discharge unit; and a discharge flow meter that is installed on the second sub-pipe of the discharge unit so as to be positioned between the discharge valve and the discharge nozzle and is formed so as to measure a flow rate of the gas flowing out of the rack.

Here, the purge assembly may further include a control unit that is connected to the supply valve and the discharge valve and controls the opening and closing of each of the supply valve and the discharge valve.

Here, the control unit may be formed so as to open and close the supply valve or the discharge valve on the basis of a difference between a supply flow rate that is measured by the supply flow meter and a discharge flow rate that is measured by the discharge flow meter.

Here, the rack may further include: a container detecting sensor detecting the presence of the container; and the control unit may be formed so as to open and close the supply valve or the discharge valve on the basis of a detection result of the container detecting sensor.

According to another aspect of the invention, there is provided an apparatus for stocking and purging a wafer at a ceiling. The apparatus may include: a rail that is installed on a ceiling; a vehicle that is formed so as to move along the rail and is formed so that a container containing wafers therein is loaded on the vehicle; a plurality of stock systems that are installed on the ceiling so as to be positioned next to the rail and are formed so as to receive the container from the vehicle and stock the container; and a purge assembly that is installed so as to communicate with the container through the stock system and is formed so as to purge the wafers, which are contained in the container, with gas.

Here, the stock system may include: a bottom frame; a pair of side wall frames that are joined to both end portions of the bottom frame and are formed so as to be positioned between the bottom frame and the ceiling; and a rack that is installed on the bottom frame so as to support the container and includes a supply nozzle and a discharge nozzle communicating with the container.

Here, the purge assembly may include: a supply unit that is formed so as to supply the gas into the container through the supply nozzle and includes a supply valve formed so as to start or stop supplying the gas; a discharge unit that is formed so as to discharge the gas, which is supplied into the container, to the outside through the discharge nozzle and includes a discharge valve formed so as to start or stop discharging the gas; and a control unit that controls an operation of the supply valve or the discharge valve on the basis of the amount of the gas present in the container.

Advantage of the Invention

According to the apparatus for stocking and purging a wafer at a ceiling of the invention, which has been formed as described above, it is possible to improve the availability of a space on the bottom of a semiconductor factory and increase the time that wafers may be stocked.

BEST MODE FOR CARRYING OUT THE INVENTION

Figure 1:
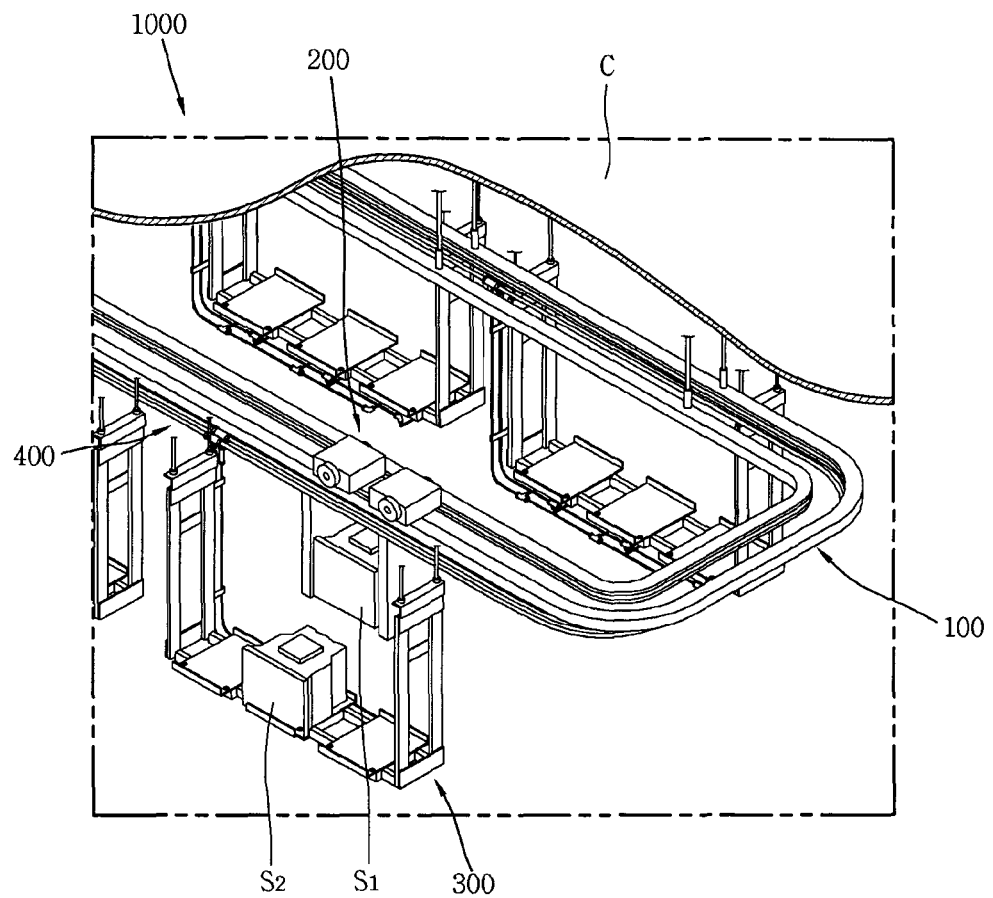
FIG. 1 is a perspective view of an apparatus 1000 for stocking and purging a wafer at a ceiling according to an embodiment of the invention.

An apparatus for stocking and purging a wafer at a ceiling according to a preferred embodiment of the invention will be described in detail below with reference to accompanying drawings. Even though embodiments are different from each other in this specification, the same or similar components are denoted by the same or similar reference numerals and the description thereof is replaced with the first description.

FIG. 1 is a perspective view of an apparatus 1000 for stocking and purging a wafer at a ceiling according to an embodiment of the invention.

Referring to FIG. 1, the apparatus 1000 for stocking and purging a wafer at a ceiling can include a rail 100, a vehicle 200, stock systems 300, and a purge assembly 400.

The rail 100 is a component that is installed on a ceiling C so as to form a moving path.

The rail 100 can be formed so as to form two lines, for example, a closed curve type line.

The vehicle 200 is installed on the rail 100 so as to move along the moving path. A container $S_1$ containing wafers is loaded on the vehicle 200. The vehicle 200 includes means for loading the container $S_1$ and means for unloading the container $S_1$.

The stock systems 300 are installed on the ceiling C and stock the containers $S_2$.

Here, the container $S_2$ is the same as the container $S_1$ loaded on the vehicle 200, but the containers $S_1$ and $S_2$ are distinguished from each other for convenience of description. Specifically, the container $S_1$ is a container to be loaded on the vehicle 200, and the container $S_2$ is unloaded to the stock system 300 from the vehicle 200 and stocked to the stock system 300.

The stock systems 300 can be disposed so as to be positioned next to the rail 100. Further, a plurality of stock systems 300 can be formed, and several to several tens of stock systems 300 can be linked to one rail 100.

The purge assembly 400 is formed to supply purge gas into the containers $S_2$ that are stocked in the stock systems 300. For this purpose, the purge assembly 400 can communicate with the containers $S_2$ through the stock systems 300.

According to this structure, the vehicle 200 loads the container $S_1$ in which wafers produced in the previous step are contained and moves along the rail 100. While moving, the vehicle 200 stops so as to correspond to the designated stock system 300. The vehicle 200 unloads the container $S_1$ and allows the container $S_2$ to be stocked in the designated stock system 300. The stocked container $S_2$ is affected by the purge assembly 400, so that the wafers contained in the container $S_2$ are purged.

Accordingly, the wafers contained in the container $S_2$ are purged with the gas, so that the wafers can be stocked for a longer time. Further, since the containers $S_2$ are stocked on the ceiling C for a longer time by the stock systems 300 and the purge assembly 400, a space near the bottom can be utilized.

The above-mentioned stock systems 300 and the purge assembly 400 will be described in more detail with reference to FIG. 2.

Figure 2:
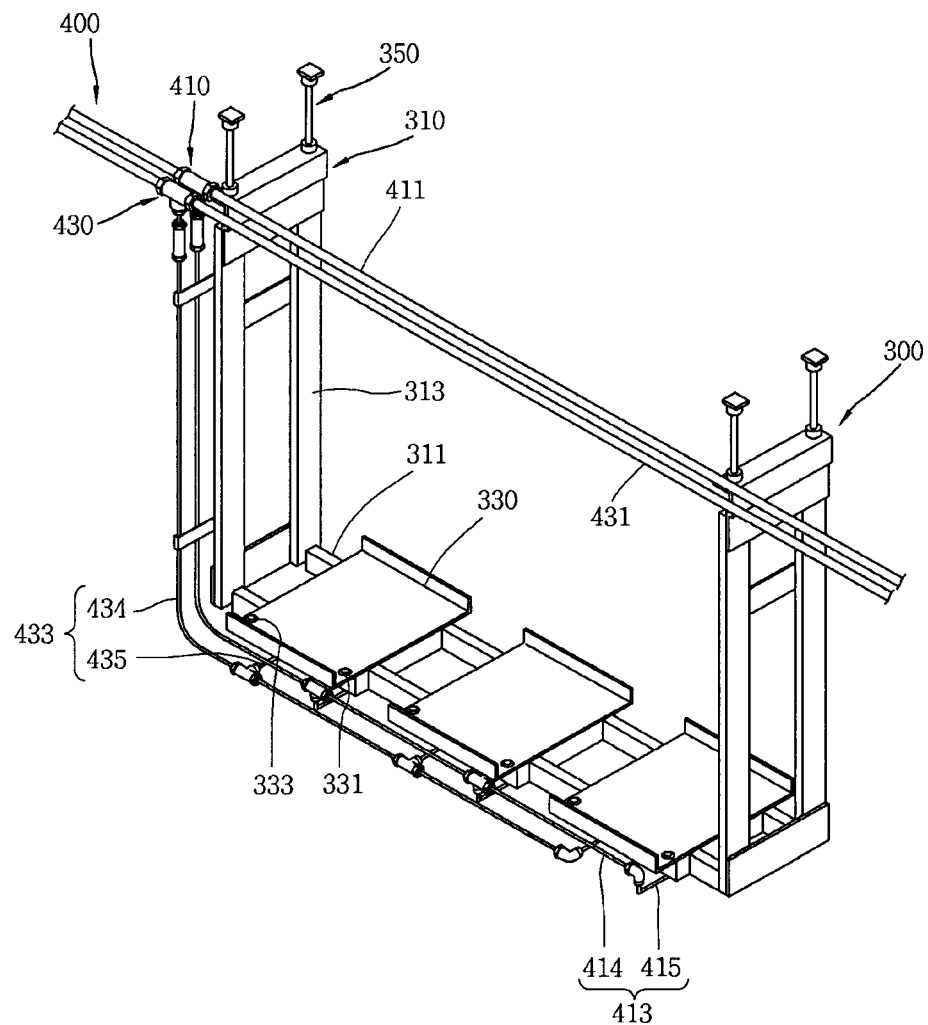
FIG. 2 is a perspective view showing stock systems 300 and a purge assembly 400 of FIG. 1.

FIG. 2 is a perspective view showing the stock systems 300 and the purge assembly 400 of FIG. 1.

Referring to FIG. 2, first, the stock system 300 can include a main body 310, racks 330, and fastening units 350.

The main body 310 is a portion that forms a framework of the stock system 300. Specifically, the main body 310 can include a bottom frame 311 and side wall frames 313. The bottom frame 311 is disposed substantially parallel to the ceiling C. The side wall frames 313 are formed at both end portions of the bottom frame 311 so as to extend toward the ceiling C in the form of a pair.

The racks 330 are installed on the main body 310, and are formed so as to support the container ($S_2$, FIG. 1). Specifically, the racks 330 are installed on the bottom frame 311 of the main body 310, and are arranged substantially parallel to the ceiling C. One bottom frame 311 can be provided with one or more racks 330. A case in which three racks 330 are installed on one bottom frame 311 is exemplified in this embodiment. The rack 330 is provided with a supply nozzle 331 and a discharge nozzle 333 that are formed so as to communicate with the container ($S_2$, FIG. 1).

The fastening units 350 are installed on the main body 310, specifically, the side wall frames 313 so that the main body 310 is fastened to the ceiling C. These fastening units 350 may be the same as the structure that fastens the rail 100 to the ceiling C.

Next, the purge assembly 400 can include a supply unit 410 and a discharge unit 430. The supply unit 410 is formed so as to supply the gas into the container ($S_2$, FIG. 1). In contrast, the discharge unit 430 is formed so as to discharge the gas, which is filled in the container ($S_2$, FIG. 1), to the outside.

Here, the supply unit 410 and the discharge unit 430 can include main pipes 411 and 431 and sub-pipes 413 and 433, respectively.

The main pipe 411 of the supply unit 410 communicates with a tank that supplies the gas, and the main pipe 431 of the discharge unit 430 communicates with a tank that recovers the gas. The main pipes 411 and 431 can be installed on the side surface of the rail 100 and can be formed so as to extend along the rail 100 (see FIG. 1).

The sub-pipes 413 and 433 connect the main pipes 411 and 431 with the rack 330 (the supply nozzle 331 and the discharge nozzle 333), respectively. If one rail (100, FIG. 1) is provided with one main pipe 411 and one main pipe 431, a plurality of sub-pipes 413 and 433 can be branched from the main pipes 411 and 431 so as to correspond to the respective stock systems 300, respectively. The sub-pipe 413 of the supply unit 410 can include a first sub-pipe 414 that is connected to the main pipe 411 and a second sub-pipe 415 that connects the first sub-pipe 414 with the supply nozzle 331. Likewise, the sub-pipe 433 of the discharge unit 430 can include a first sub-pipe 434 that is connected to the main pipe 431 and a second sub-pipe 435 that connects the first sub-pipe 434 with the supply nozzle 333. Here, the flow cross-sectional areas of the second sub-pipes 415 and 435 may be smaller than the flow cross-sectional areas of the first sub-pipes 414 and 434, respectively.

Next, a purge operation of the purge assembly 400 will be described with reference to FIG. 3.

Figure 3:
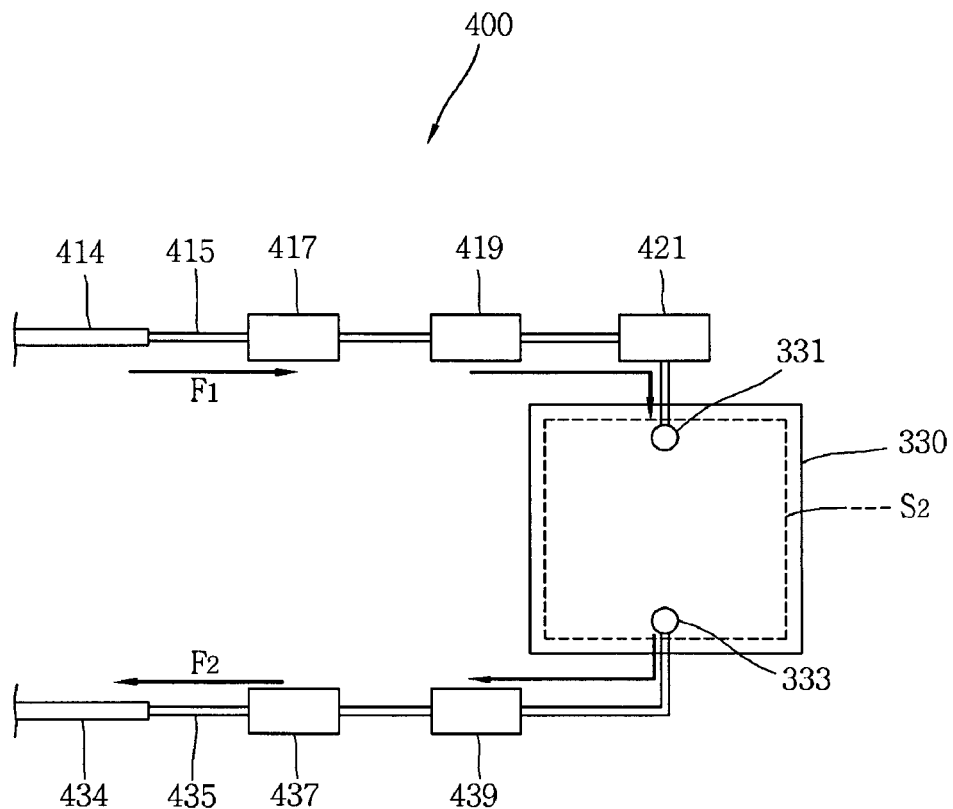
FIG. 3 is a conceptual diagram illustrating a purge operation for a container $S_2$ that is performed by a purge assembly 400 of FIG. 2.

FIG. 3 is a conceptual diagram illustrating a purge operation for the container $S_2$ that is performed by the purge assembly 400 of FIG. 2.

Referring to FIG. 3, the supply unit 410 can further include a supply valve 417, a supply flow meter 419, and a gas filter 421 in addition to the main pipe 411 and the sub-pipe 413 that have been described above. All of the supply valve 417, the supply flow meter 419, and the gas filter 421 are installed so as to communicate with the second sub-pipe 415. The supply valve 417 is formed so as to open and close a flow channel through which the gas flows in the second sub-pipe 415. The supply valve 417 is an electric valve, and is formed so as to perform an operation for opening and closing the flow channel in response to an electric signal. The supply flow meter 419 is disposed between the supply valve 417 and the supply nozzle 331, and measures the flow rate of the gas flowing to the supply nozzle 331. The gas filter 421 is installed between the supply flow meter 419 and the supply nozzle 331, and filters the gas, which is supplied into the container $S_2$ through the supply nozzle 331, to remove foreign substances from the gas.

The discharge unit 430 can further include a discharge valve 437 and a discharge flow meter 439 in addition to the main pipe 431 and the sub-pipe 433 that have been described above. All of the discharge valve 437 and the discharge flow meter 439 are installed so as to communicate with the second sub-pipe 435. The discharge valve 437 is formed so as to open and close a flow channel through which the gas flows in the second sub-pipe 435. The discharge valve 437 is an electric valve, and is formed so as to perform an operation for opening and closing the flow channel in response to an electric signal. The discharge flow meter 439 is disposed between the discharge valve 437 and the discharge nozzle 333, and measures the flow rate of the gas that is discharged to the outside of the container $S_2$ through the discharge nozzle 333.

An operating method of the above-mentioned purge assembly 400 will be described additionally with reference to FIG. 4. Here, FIG. 4 is a block diagram illustrating the control configuration of the purge assembly 400 of FIG. 3.

Figure 4:
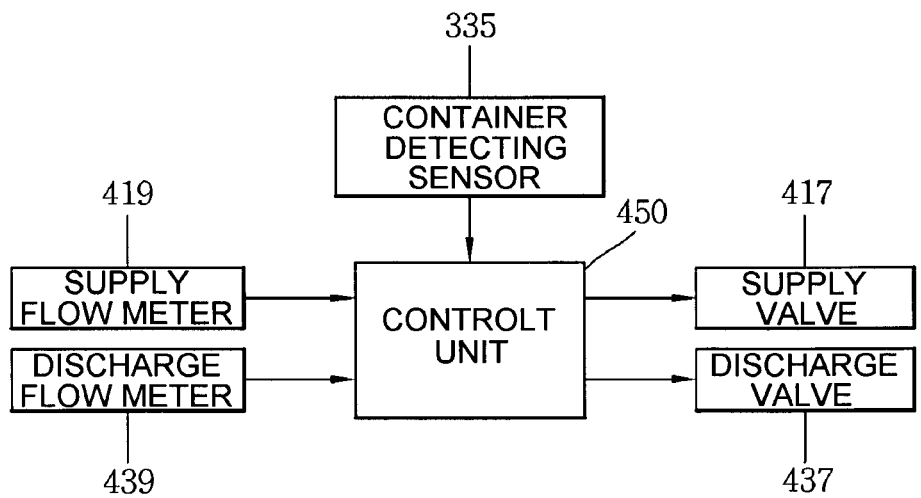
FIG. 4 is a block diagram illustrating the control configuration of the purge assembly 400 of FIG. 2.

Referring to FIGS. 3 and 4, the rack 330 can further include a container detecting sensor 335. The container detecting sensor 335 is installed on the upper surface of the rack 330, and is formed so as to determine whether or not the container $S_2$ is placed on the rack 330.

The purge assembly 400 can further include a control unit 450 that controls the operations of the supply unit 410 and the discharge unit 430 that have been described above. Various kinds of information are input to the control unit 450 from the supply flow meter 419, the discharge flow meter 439, and the container detecting sensor 335, and the control unit 450 can control the operations of the supply valve 417 and the discharge valve 437.

For example, the control unit 450 can control the opening and closing of the supply valve 417 and the discharge valve 437 on the basis of a difference between the supply flow rate that is measured by the supply flow meter 419 and the discharge flow rate that is measured by the discharge flow meter 439. Specifically, when the discharge flow rate is subtracted from the supply flow rate, the amount of the gas filled in the container $S_2$ is calculated. If the amount of the gas filled in the container is smaller than a reference value, the discharge valve 437 can be closed while the supply valve 417 is opened. In contrast, if the amount of the gas filled in the container exceeds the reference value, the discharge valve 437 can be opened while the supply valve 417 is closed.

Further, the control unit 450 can control the opening and closing of the supply valve 417 and/or the discharge valve 437 on the basis of a detection result of the container detecting sensor 335. Specifically, when the container detecting sensor 335 detects that the container $S_2$ is present on the rack 330, the control unit 450 can open the supply valve 417. When a certain amount of the gas is filled in the container $S_2$ after the control unit 450 controls the opening of the supply valve 417 and a predetermined time has passed, the control unit 450 can control the opening of the discharge valve 437.

The above-mentioned apparatus for stocking and purging a wafer at a ceiling is not limited to the structure and the operating method of each embodiment that has been described above. Each embodiment can be formed so as to be variously modified by the selective combination of all or a part of each embodiment.

DESCRIPTION OF REFERENCE NUMERALS AND SIGNS

100: rail
200: vehicle
300: stock system
310: main body
330: rack
331: supply nozzle
333: discharge nozzle
400: purge assembly
410: supply unit
411: main pipe
413: sub-pipe
417: supply valve
419: supply flow meter
430: discharge unit
431: main pipe
433: sub-pipe
437: discharge valve
439: discharge flow meter
450: control unit

What is claimed is:

1. An apparatus for stocking and purging a wafer at a ceiling, the apparatus comprising:
   a rail that is formed so as to be installed on a ceiling to guide a vehicle;
   a stock system that is formed so as to be installed on the ceiling and is formed so as to receive a container, which contains wafers, from the vehicle and stock the container; and
   a purge assembly that is installed so as to communicate with the container through the stock system and is formed so as to purge the wafers, which are contained in the container, with gas;

wherein the purge assembly includes
  a supply unit that is formed so as to supply the gas into the container; and
  a discharge unit that is formed so as to discharge the gas, which is supplied into the container, to the outside; and
wherein the rack includes a supply nozzle and a discharge nozzle that are formed so as to communicate with the inside of the container, and
each of the supply unit and the discharge unit includes
  a main pipe that is formed so as to extend along the rail and is formed so that the gas flows in the main pipe; and
  a sub-pipe that communicates with the main pipe and is connected to the supply nozzle or the discharge nozzle.

2. The apparatus according to claim 1, wherein the main body includes
  a bottom frame on which the rack is installed; and
  a pair of side wall frames that are joined to both end portions of the bottom frame and includes the fastening units installed at free ends of the side wall frames.

3. The apparatus according to claim 1,
wherein the sub-pipe includes
  a first sub-pipe that communicates with the main pipe; and
  a second sub-pipe that connects the first sub-pipe with the supply nozzle or the discharge nozzle and has a flow cross-sectional area smaller than the flow cross-sectional area of the first sub-pipe.

4. The apparatus according to claim 3,
wherein the supply unit further includes
  a supply valve that is installed on the second sub-pipe of the supply unit and is formed so as to open and close the second sub-pipe of the supply unit; and
  a supply flow meter that is installed on the second sub-pipe of the supply unit so as to be positioned between the supply valve and the supply nozzle and is formed so as to measure a flow rate of the gas flowing in the rack.

5. The apparatus according to claim 4,
wherein the supply unit further includes a gas filter that is installed on the second sub-pipe of the supply unit so as to be positioned between the supply flow meter and the supply nozzle of the rack.

6. The apparatus according to claim 4,
wherein the discharge unit includes
  a discharge valve that is installed on the second sub-pipe of the discharge unit and is formed so as to open and close the second sub-pipe of the discharge unit; and
  a discharge flow meter that is installed on the second sub-pipe of the discharge unit so as to be positioned between the discharge valve and the discharge nozzle and is formed so as to measure a flow rate of the gas flowing out of the rack.

7. The apparatus according to claim 6,
wherein the purge assembly further includes a control unit that is connected to the supply valve and the discharge valve and controls the opening and closing of each of the supply valve and the discharge valve.

8. The apparatus according to claim 7,
wherein the control unit is formed so as to open and close the supply valve or the discharge valve on the basis of a difference between a supply flow rate that is measured by the supply flow meter and a discharge flow rate that is measured by the discharge flow meter.

9. The apparatus according to claim 7,
wherein the rack further includes a container detecting sensor detecting the presence of the container, and
the control unit is formed so as to open and close the supply valve or the discharge valve on the basis of a detection result of the container detecting sensor.

* * * * *